United States Patent [19]

Correale, Jr.

[11] Patent Number: 5,789,807
[45] Date of Patent: Aug. 4, 1998

[54] ON-CHIP POWER DISTRIBUTION FOR IMPROVED DECOUPLING

[75] Inventor: Anthony Correale, Jr., Raleigh, N.C.

[73] Assignee: International Business Machines Corporation, Armonk, N.Y.

[21] Appl. No.: 979,355

[22] Filed: Nov. 26, 1997

Related U.S. Application Data

[63] Continuation of Ser. No. 729,977, Oct. 15, 1996, abandoned.

[51] Int. Cl.$^6$ ............................................. H01L 23/52
[52] U.S. Cl. ......................................... 257/691; 257/758
[58] Field of Search ............................... 257/296, 368, 257/758, 760, 691, 298

[56] References Cited

U.S. PATENT DOCUMENTS

| | | | |
|---|---|---|---|
| 3,777,221 | 12/1973 | Tatusko et al. | 317/101 |
| 4,623,911 | 11/1986 | Pryor | 357/45 |
| 4,785,135 | 11/1988 | Ecker et al. | 174/34 |
| 4,811,082 | 3/1989 | Jacobs et al. | 357/80 |
| 4,866,507 | 9/1989 | Jacobs et al. | 357/74 |
| 4,947,229 | 8/1990 | Tanaka et al. | 357/45 |
| 5,063,432 | 11/1991 | Mu | 357/70 |
| 5,081,561 | 1/1992 | Smith | 361/400 |
| 5,101,323 | 3/1992 | Prevost | 361/394 |
| 5,111,271 | 5/1992 | Hatada et al. | 357/45 |
| 5,165,055 | 11/1992 | Metsler | 333/12 |
| 5,208,725 | 5/1993 | Carey | 361/792 |
| 5,285,018 | 2/1994 | Pence, IV | 174/261 |
| 5,391,921 | 2/1995 | Kudoh et al. | 257/758 |
| 5,410,107 | 4/1995 | Schaper | 174/255 |
| 5,446,311 | 8/1995 | Ewen et al. | 257/758 |
| 5,459,355 | 10/1995 | Kreifels | 257/758 |
| 5,468,997 | 11/1995 | Imai et al. | 257/758 |
| 5,598,029 | 1/1997 | Suzuki | 257/760 |

*Primary Examiner*—Mahshid D. Saadat
*Assistant Examiner*—S. V. Clark
*Attorney, Agent, or Firm*—Steven B. Phillips; Thomas F. Galvin

[57] ABSTRACT

A specific structure which improves the decoupling capacitance for the power conductors in parallel metal layers of a semiconductor device. The power conductors are arranged so that conductors vertically adjacent to each other in the two outer of three metal layers are never connected to the same supply voltage terminal, but rather to opposing terminals. To improve current carrying capacity and reduce area, a power conductor in one outer plane is connected to a power conductor in the other outer plane which is displaced vertically and laterally from the first power conductor. The connection is made through special stitch conductors in the intervening plane. The resulting structure improves power supply decoupling for the finished device by providing significantly greater capacitance associated with the power distribution system of the chip.

8 Claims, 4 Drawing Sheets

ON-CHIP POWER DISTRIBUTION FOR IMPROVED DECOUPLING

The application is a continuation of application Ser. No. 08/729,977, filed Oct. 15, 1996, now abandoned.

BACKGROUND

1. Field of the Invention

This invention is related to power supply decoupling techniques employed on semiconductor integrated circuits. In particular, the invention relates to improving power distribution decoupling on an integrated circuit.

2. Definition of the Problem

Power supply decoupling is very desirous for optimal performance of all electronic circuits, including integrated circuits. A traditional integrated circuit using a semiconductor substrate as shown in FIG. 1 has some inherent bulk decoupling due to the capacitance between the components and the substrate or well. This capacitance is illustrated by a capacitor C shown connected between an n well and the p substrate.

Silicon on insulator (SOI) technology, as shown in FIG. 2, employs a semiconductor substrate, but the devices are separated from the bulk semiconductor by an insulation layer. Additionally, the wells used in conventional devices are not present. Since the devices on an SOI chip are isolated from any bulk silicon and each other, there are no inherent bulk capacitances to serve as a major source of on-chip, parasitic power supply decoupling. In fact, diffusion capacitance for SOI devices is an order of magnitude less than for non-SOI based technologies. The absence of wells further reduces the junction capacitance when compared to P-well and N-well based technologies. A technique currently employed to provide decoupling for SOI devices and conventional devices in which the bulk capacitance is insufficient is the use of explicitly defined decoupling capacitors. Defined capacitors on an integrated circuit are costly and consume a great deal of chip area. What is needed is a way to use the existing structure of the chip to provide decoupling capacitance thereby eliminating or at least minimizing the need for adding dedicated decoupling capacitors. Such a technique would be especially useful with SOI devices, but could also be employed with other technologies where additional decoupling is required.

SUMMARY

The present invention meets the above described needs by providing a specific structure which improves the inherent capacitance of the power distribution network for a semiconductor device or integrated circuit. The invention is designed to work on a chip with at least two supply voltage terminals, one typically being connected to ground and the other to $V_{dd}$. The semiconductor material contains at least three parallel electric conductor planes, often called metallization layers or simply metal-1, metal-2, etc. Each plane has a plurality of power conductors to carry supply voltages to the various circuits integrated into the device.

According to the invention, the power conductors are arranged so that conductors vertically adjacent and parallel to each other where one conductor is in each of the outer two of the three planes are never connected to the same supply voltage terminal, and are preferably connected to opposing supply voltage terminals. I call these "vertically adjacent conductors" even though they are separated by an intervening plane.

According to the invention, the intervening plane of the three electric conductor planes provides a mechanism to connect power conductors connected to the same supply voltage terminals in the outer two planes together. In order to accomplish this connection, a power conductor must be connected to a second conductor in the other of the outer two planes which is laterally and vertically displaced from the first conductor. In the preferred embodiment, this connection is accomplished with a short power conductor in the middle plane which I call a stitch. Therefore, the middle plane contains a plurality of stitches arranged to be perpendicular to the power conductors in the outer two planes. Each stitch is connected at each end to a power conductor through a via in the semiconductor material making up the integrated circuit. The via at one end of a stitch is connected to a power conductor in one of the two outer planes, and the via at the other end of a stitch is connected to a power conductor in the other of the two outer planes. The two power conductors connected to a stitch are connected to the same supply voltage terminal. Each of the electric conductor planes has a plurality of signal conductors which run parallel to the power conductors or stitches.

This invention causes the metal layers of a semiconductor chip to interact in the manner of a large capacitor. The condition provides decoupling which reduces electrical noise, without adding capacitors to the chip. Since capacitors do not have to be added, chip area is saved.

DETAILED DESCRIPTION OF THE PREFERRED EMBODIMENT

The preferred embodiment of the present invention is a VLSI or very large scale integration semiconductor device. Such a device is manufactured with layers of metal, which I call electric conductor planes. These layers of metal are also often called metallization levels, metal-1, metal-2, metal-3, or simply M1, M2, M3 etc. On many VLSI designs, three levels of metal are used and the numbering convention is to start with the bottom level relative to how the device is normally pictured. Those of ordinary skill in the art will recognize that the orientation can vary and is simply a matter of convention. Normally conductors in odd-numbered planes, such as M1 and M3, are routed in the same direction, while conductors in even-numbered planes, such as M2, are routed orthogonally to the conductors in the odd-numbered planes. In a three-plane structure, M1 is used for local power distribution and circuit interconnect. M3 is used for global power distribution and circuit interconnect, and M2 is used for circuit interconnect and power stitching (to be explained below) of the M1 and M3 power conductors. For chips having perimeter-based I/O, a power bus ring around the chip periphery is used to distribute power from the power supply voltage terminals of the device to the internal power distribution network. In most cases the supply voltages are ground and a positive voltage which is denoted $V_{dd}$.

To provide enough current carrying capacity in the power conductors of the M1 and M3 planes in a minimum of chip area, M1 and M3 conductors connected to ground are connected together through power pads or "stitches" in the M2 plane. Likewise, M1 and M3 conductors connected to $V_{dd}$ are connected the same way. Connections between the M1 and M2 planes, or between the M2 and M3 planes are made through vias in the semiconductor material. A via or contact is formed by opening a hole in the insulating material between two vertical layers and then depositing a conducting material, typically aluminum, aluminal-copper, or tungsten into the hole. This conducting material comes into contact with the layers below it and the soon to be deposited layer above it, thereby forming a conduction via between two metal wiring layers. The following relationship illustrates the area associated with M1 ground and $V_{dd}$ conductors connected to M3 ground and $V_{dd}$ conductors compared to M1 and M3 conductors alone to provide a given current capacity:

$$(Wm1g+Wm1v) \geq (Wm3g+Wm3v) > (Wm13g+Wm13v);$$

where Wm1g is the width of the M1 ground conductor, Wm3g is the width of the M3 ground conductor and Wm13g is the width of the M1 and M3 ground conductor pair. The terms with the v denote the $V_{dd}$ conductors in the same way.

Figure 1:
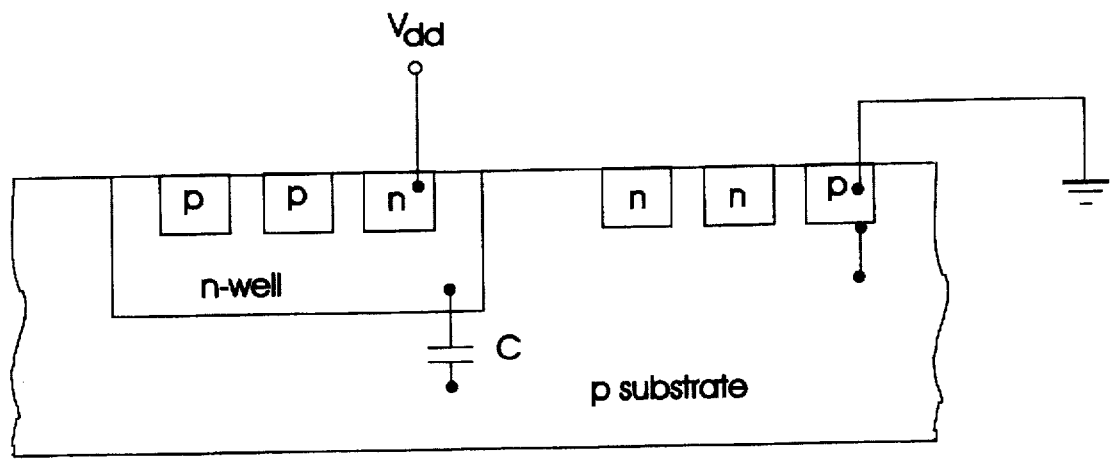
FIG. 1 shows how a standard semiconductor device of the prior art possesses inherent bulk capacitance.
Figure 2:
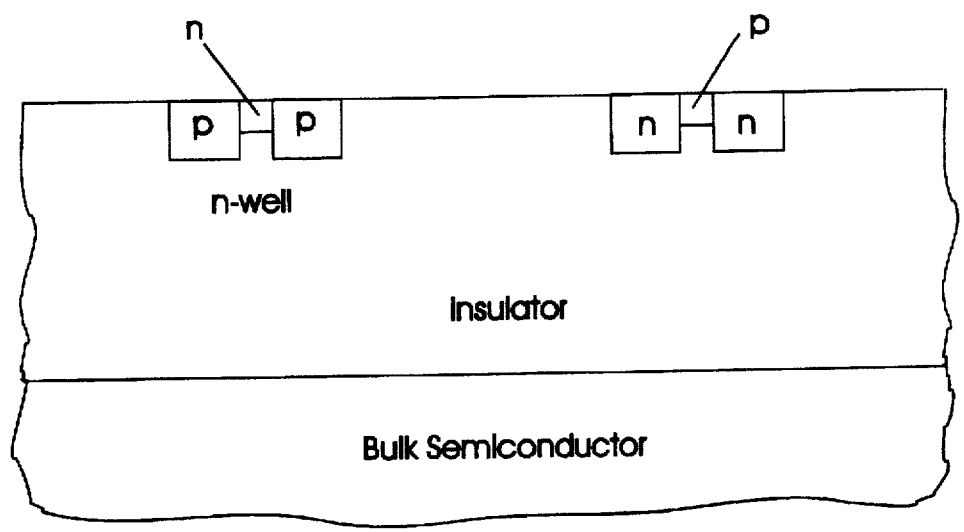
FIG. 2 shows how a semiconductor device formed on an insulator has no inherent bulk capacitance.
Figure 3:
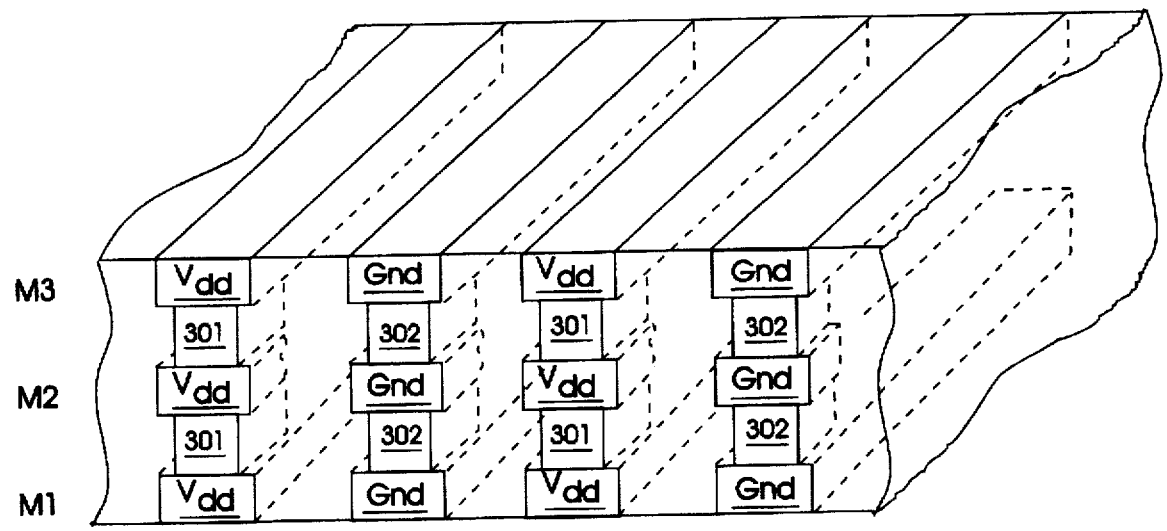
FIG. 3 shows in a cross-sectional view how the power conductors in a prior art semiconductor device are arranged and connected.
Figure 4:
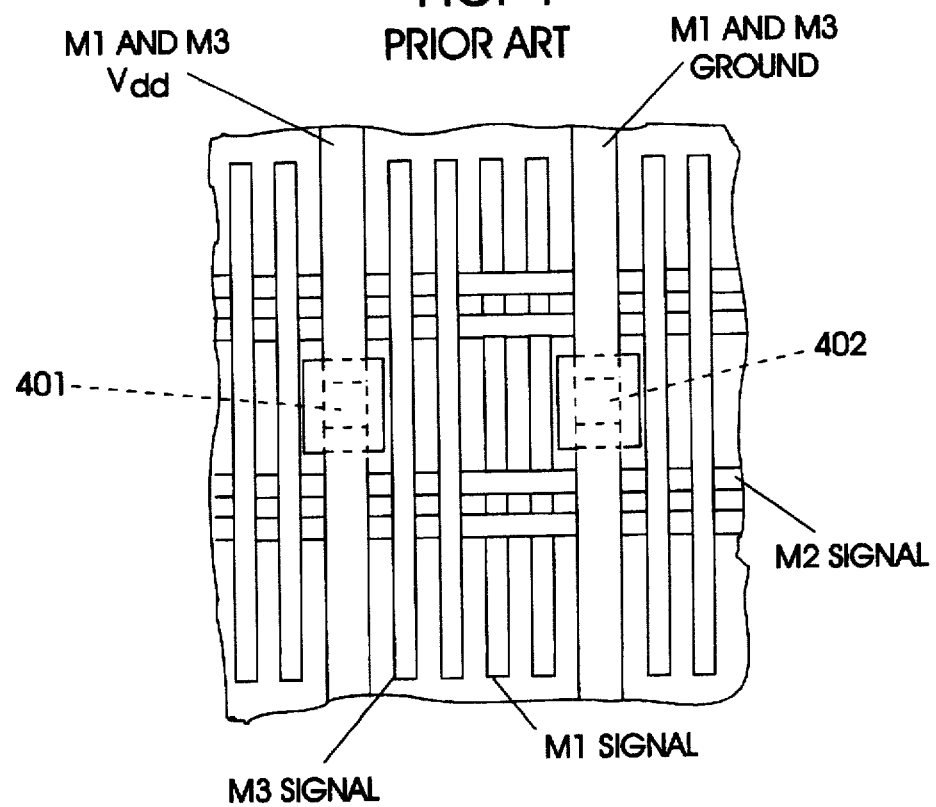
FIG. 4 shows in a top-down view how the power conductors in a prior art semiconductor device are arranged and connected.

In prior-art designs, the ground conductors in M1 are directly under ground conductors in M3 and $V_{dd}$ conductors in M1 are directly under $V_{dd}$ conductors in M3. FIG. 3 shows a VLSI semiconductor device cross section according to the prior art, with the size of the power conductors exaggerated and the signal conductors omitted for clarity. Vias 301 connect the $V_{dd}$ conductors in the M1 and M3 layer together through pads in the M2 layer. Vias 302 connect the ground conductors in the M1 and M3 layers together through pads in the M2 layer. FIG. 4 shows a more accurate top-down view of a small portion of the same device. The vias 401 and 402 are shown dotted since the top power conductors prevent them from being seen directly. This arrangement provides little capacitance associated with the power distribution network since vertically adjacent power conductors are connected together and to the same supply voltage terminal.

The present invention maintains the current carrying capacity and area advantage of the scheme just described, in a three metal level structure; however, the capacitance of the power distribution network is greatly increased. According to the preferred embodiment, the power conductors in the M1 and M3 electric conductor planes are arranged so that the vertically adjacent conductors in the M1 and M3 planes are never connected to the same supply voltage terminal. A ground conductor in M1 is under a $V_{dd}$ conductor in M3 and a $V_{dd}$ conductor in M1 is under a ground conductor in M3. Thus, each pair of vertically adjacent conductors, one in M1 and one in M3, form a sandwich in which the two conductors are at opposite potentials in the same way the plates of a parallel-plate capacitor are at opposite potentials. In this arrangement, stitching must be provided not between M1 and M3 conductors directly vertically adjacent to each other, but between conductors that are vertically and laterally displaced from each other. To accomplish this, the stitches are elongated and placed in the M2 plane perpendicular to the conductors in the M1 and M3 planes. A stitch is connected at one end through a via in the semiconductor material to a conductor in the M1 plane, and at the other end through a via to a conductor in the M3 plane. The stitches alternate between the two supply voltages, in the preferred embodiment, $V_{dd}$ and ground.

Figure 5A:
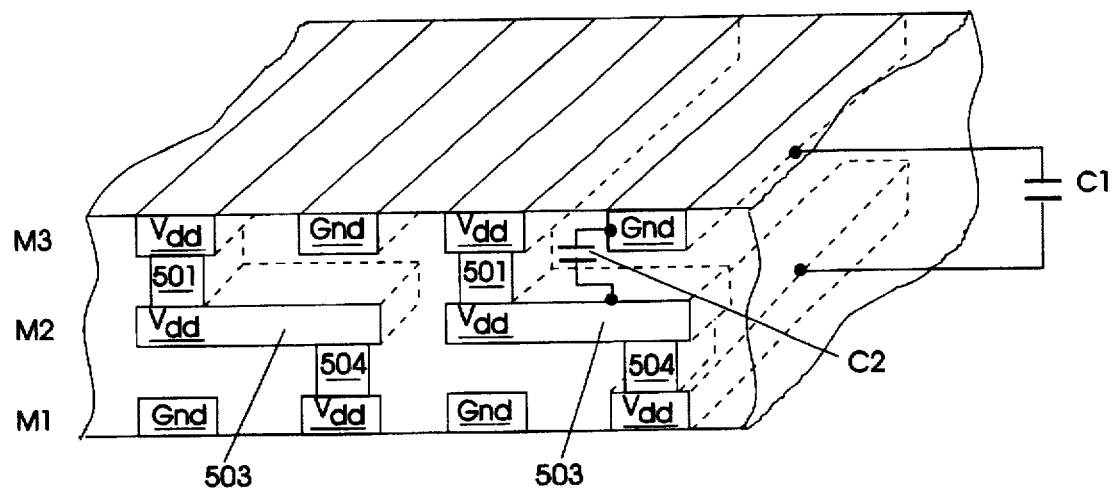
FIG. 5A shows a cross-sectional view of a semiconductor device according to the present invention.
Figure 5B:
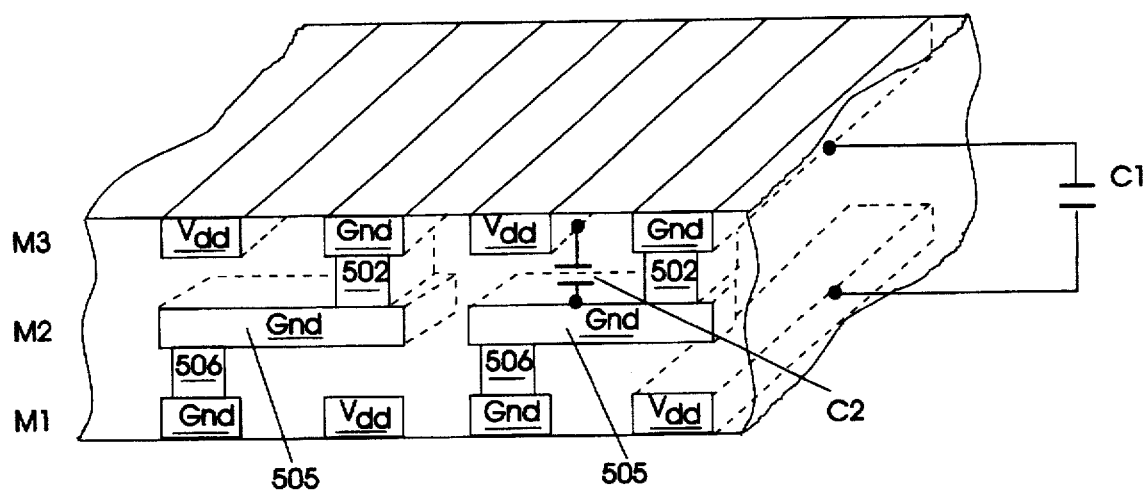
FIG. 5B shows a different cross-sectional view of a semiconductor device according to the present invention.

FIGS. 5A and 5B show two cross sections taken in a semiconductor chip in which the invention is employed. In these Figures, the size of the conductors and stitches is exaggerated and the signal conductors are omitted for clarity. FIG. 5A shows a cross section cut at the $V_{dd}$ stitches 503. The stitches are connected to the M3 $V_{dd}$ conductors through vias 501 and to the M1 $V_{dd}$ conductors through vias 504. FIG. 5B shows a cross section cut at the ground stitches 505. The ground stitches are connected to the M3 ground conductors through vias 502 and to the M1 ground conductors through vias 506. In both FIGS. 5A and 5B, the capacitance between the $V_{dd}$ conductors in one of the outer planes and the ground conductors in the other is illustrated by capacitor C1. Note that additional capacitance is gained between conductors in M1 or M3 and the stitches that are connected to the opposite supply voltage terminal as illustrated by capacitor C2.

Figure 6:
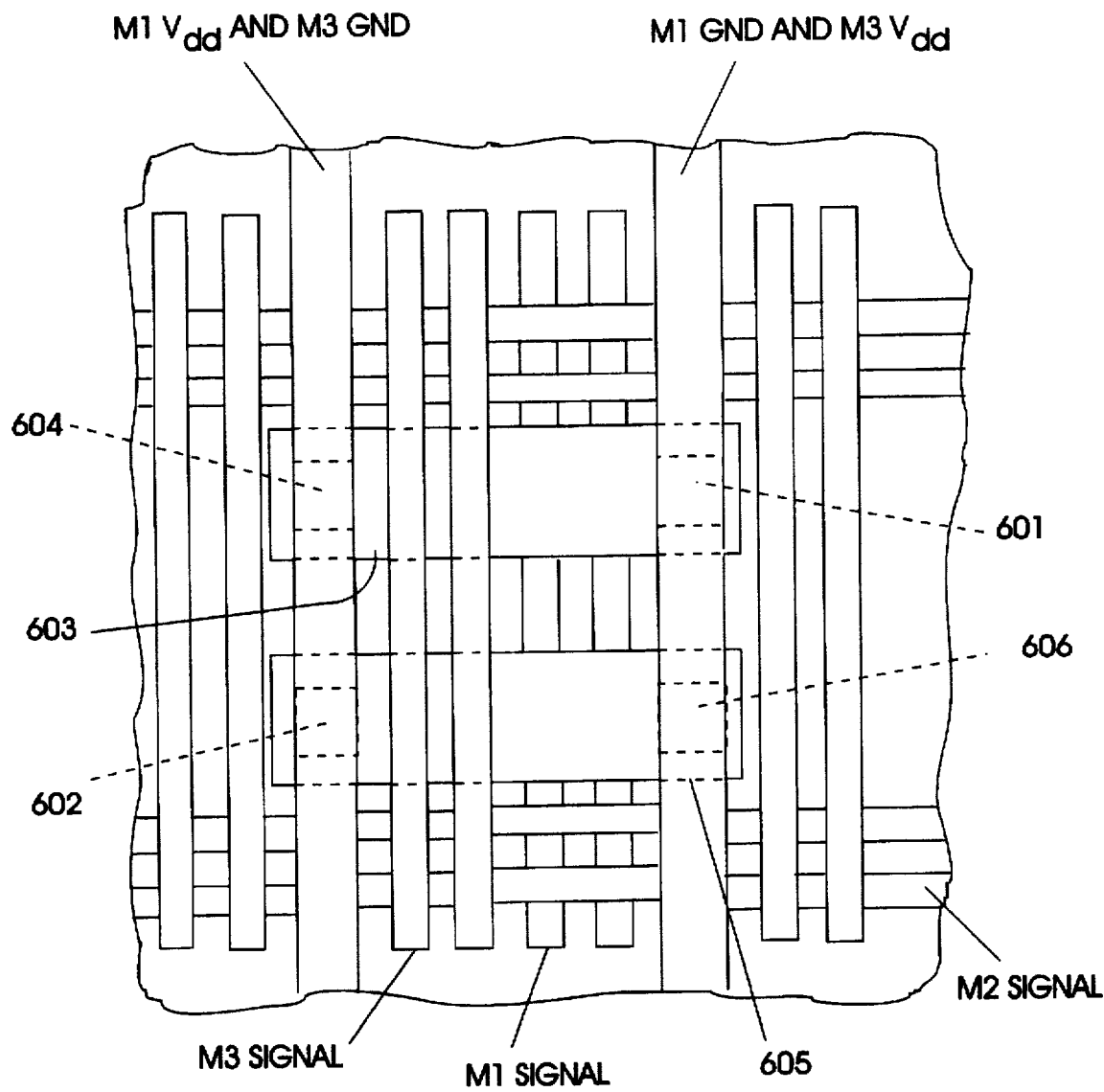
FIG. 6 shows a top-down view of a semiconductor device according to the present invention.

FIG. 6 shows a top-down view of a small section of the same device with signal conductors and more realistic proportions. $V_{dd}$ stitch 603 is connected to M3 $V_{dd}$ through via 601 and to M1 $V_{dd}$ through via 604. Ground stitch 605 is connected to M1 ground through via 606 and to M3 ground through via 602.

For a typical technology, an arrangement according to the invention increases the metal decoupling capacitance significantly as compared to the vertical sandwich arrangement of FIG. 3 because the overall distribution encompasses a large area. If one examines the total metal area associated with the power distribution relative to the associated diffusion area, it is not uncommon to find a ratio of 6:1 metal to diffusion area. Improving the decoupling capacitance of the metal will therefore increase the power supply decoupling for the device significantly. Although I have described a specific embodiment of the invention, those of ordinary skill in the art will recognize that the invention has other embodiments, all of which are encompassed by the inventive concept.

I claim:

1. An integrated circuit comprising:

first and second supply voltage terminals;

semiconductor material;

at least three electric conductor planes disposed in the semiconductor material;

a plurality of parallel power conductors disposed within the outer two of three of the electric conductor planes, the power conductors arranged so that vertically adjacent parallel conductors are never connected to the same supply voltage terminal to provide substantial capacitance between the power conductors;

a plurality of stitches disposed within the intervening plane, each of the plurality of stitches arranged to be perpendicular to the power conductors, each stitch connected at one end through a via in the semiconductor material to a power conductor in one of the outer two planes and at the other end through a via in the semiconductor material to a power conductor in the other of the outer two planes, the two power conductors connected to a stitch also being connected to the same supply voltage terminal; and a plurality of signal conductors disposed in each of the three electric conductor planes so as not to intersect or be in connection with a power conductor or a stitch.

2. The integrated circuit of claim 1 wherein the semiconductor material contains an insulation layer.

3. The integrated circuit of claim 1 wherein the first supply voltage is a positive voltage and the second supply voltage is ground.

4. The integrated circuit of claim 2 wherein the first supply voltage is a positive voltage and the second supply voltage is ground.

5. An integrated circuit comprising:

first and second supply voltage terminals;

semiconductor material;

at least three electric conductor planes disposed in the semiconductor material;

a plurality of parallel power conductors disposed within the outer two of three of the electric conductor planes, the power conductors arranged so that vertically adjacent conductors are never connected to the same supply voltage terminal, each power conductor in one of the two outer planes connected to at least one vertically and laterally displaced parallel power conductor in the other of the two outer planes, the connection being made through the intervening electric conductor plane to provide substantial capacitance between the power conductors; and a plurality of signal conductors disposed in each of the three electric conductor planes.

6. The integrated circuit of claim 5 wherein the semiconductor material contains an insulation layer.

7. The integrated circuit of claim 5 wherein the first supply voltage is a positive voltage and the second supply voltage is ground.

8. The integrated circuit of claim 6 wherein the first supply voltage is a positive voltage and the second supply voltage is ground.

* * * * *